(12) United States Patent
Deng et al.

(10) Patent No.: US 12,399,406 B2
(45) Date of Patent: Aug. 26, 2025

(54) DISPLAY PANEL, DISPLAY DEVICE (71) Applicants: Chengdu BOE Optoelectronics Technology Co., Ltd., Sichuan (CN); BOE Technology Group Co., Ltd., Beijing (CN)

(72) Inventors: Yin Deng, Beijing (CN); Haohao Li, Beijing (CN); Bo Wu, Beijing (CN); Xiongcan Zuo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/026,650

(22) PCT Filed: Jun. 30, 2022

(86) PCT No.: PCT/CN2022/102734
§ 371 (c)(1),
(2) Date: Mar. 16, 2023

(87) PCT Pub. No.: WO2024/000374
PCT Pub. Date: Jan. 4, 2024

(65) Prior Publication Data
US 2024/0288737 A1 Aug. 29, 2024

(51) Int. Cl.
*G02F 1/1362* (2006.01)
*H05K 1/18* (2006.01)

(52) U.S. Cl.
CPC .. *G02F 1/136286* (2013.01); *G02F 1/136204* (2013.01); *G02F 1/136209* (2013.01); *H05K 1/189* (2013.01); *H05K 2201/10136* (2013.01)

(58) Field of Classification Search
CPC ......... G02F 1/136286; G02F 1/136204; G02F 1/136209; G02F 1/136254; G02F 1/1345;
(Continued)

(56) References Cited

U.S. PATENT DOCUMENTS

2006/0055859 A1* 3/2006 Jin .................... G02F 1/134363
349/141
2014/0055696 A1* 2/2014 Lee ................... G02F 1/133305
349/20

(Continued)

FOREIGN PATENT DOCUMENTS

CN 108983476 A 12/2018
CN 113109963 A 7/2021
(Continued)

*Primary Examiner* — James A Dudek
(74) *Attorney, Agent, or Firm* — WHDA, LLP (57) ABSTRACT

The present application provides a display panel, including: a substrate, including a display area and a peripheral area surrounding the display area; a first conductive layer, located on a side of the substrate and including a plurality of data lines located in the display area; and a second conductive layer, located on a side of the first conductive layer facing away from the substrate and including at least one first heating line group, the first heating line group includes at least one first heating line, the first heating line extends from the display area to the peripheral area, and the first heating line extends in a direction same as the data line.

16 Claims, 7 Drawing Sheets

(58) Field of Classification Search
CPC .............. G02F 1/13452; G02F 1/13454; G02F 1/13456; G02F 1/13458; G02F 1/133382; G02F 2202/22; G02F 1/13306; G02F 1/133; G02F 1/136; G02F 1/1685; G02F 1/1351; G02F 1/1352; H05K 3/00; H05K 2201/10136; H05K 2201/042; H05K 2201/05; H05K 1/028; H05K 1/0281; H05K 1/0283; H05K 1/147; H05K 1/189; H05K 3/361
See application file for complete search history.

(56) References Cited

U.S. PATENT DOCUMENTS

| | | | |
|---|---|---|---|
| 2020/0073168 A1 | | 3/2020 | Zhao et al. |
| 2020/0343270 A1 | | 10/2020 | Huang |
| 2023/0402464 A1 | * | 12/2023 | Zhang ............... G02F 1/136286 |

FOREIGN PATENT DOCUMENTS

| | | | | |
|---|---|---|---|---|
| CN | 113109964 | A | | 7/2021 |
| JP | 2007199338 | A | | 8/2007 |
| JP | 2007279096 | A | * | 10/2007 |
| KR | 20060028878 | A | * | 4/2006 |
| KR | 20060087929 | A | * | 8/2006 |
| KR | 20170073069 | A | * | 8/2006 |

* cited by examiner

DISPLAY PANEL, DISPLAY DEVICE

TECHNICAL FIELD

The present disclosure relates to the field of display technology, in particular to a display panel and a display device.

BACKGROUND

Liquid crystal displays are often used in relatively extreme environments, such as a low-temperature environment, which requires liquid crystal displays to be able to display normally in these extreme environments. However, affected by the properties of the liquid crystal itself, the viscosity coefficient of the liquid crystal is too large in a low temperature environment, resulting in a significantly longer response time of the liquid crystal compared to the normal temperature environment, further resulting in a visual ghosting, especially when the temperature is low and near the crystallization temperature of the liquid crystal, the display quality of the liquid crystal display is greatly affected.

SUMMARY

Embodiments of the present application adopt technical solutions below.

In a first aspect, an embodiment of the present application provides a display panel, including:
- a substrate, including a display area and a peripheral area surrounding the display area;
- a first conductive layer, located on a side of the substrate and including a plurality of data lines located in the display area; and
- a second conductive layer, located on a side of the first conductive layer facing away from the substrate and including at least one first heating line group, the first heating line group includes at least one first heating line, the first heating line extends from the display area to the peripheral area, and extends in a direction same as an extending direction of the data line.

In some embodiments of the present application, an orthographic projection of the first heating line on the substrate at least partially overlaps with an orthographic projection of the data line on the substrate.

In some embodiments of the present application, the display panel further includes a black matrix layer located on a side of the second conductive layer facing away from the substrate, an orthographic projection of a part of the first heating line, located in the display area, on the substrate is located within an orthographic projection of the black matrix layer on the substrate, and the orthographic projection of the data line on the substrate is located within the orthographic projection of the black matrix layer on the substrate.

In some embodiments of the present application, the orthographic projection of the part of the first heating line, located in the display area, on the substrate is located within the orthographic projection of the data line on the substrate.

In some embodiments of the present application, the peripheral area further includes a first peripheral sub-area and a second peripheral sub-area located on opposite sides of the display area: the second conductive layer further includes at least one second heating line group located in the first peripheral sub-area, and the second heating line group includes at least one second heating line: each of the first heating lines in the same first heating line group respectively intersects and connects with each of the second heating lines in one of the second heating line groups.

In some embodiments of the present application, the second conductive layer further includes at least two third heating line groups located in the second peripheral sub-area, and each of the third heating line groups includes at least one third heating line: a number of the third heating line groups is twice a number of the second heating line groups: some first heating lines in the same first heating line group intersect and connect with each of the third heating lines in one of the third heating line groups, other first heating lines in the same first heating line group intersect and connect with each of the third heating lines in another one of the third heating line groups.

In some embodiments of the present application, the display panel further includes at least two heating bonding terminals located in the second peripheral sub-area, one of the third heating line groups is electrically connected to one of the heating bonding terminals, and another one of the third heating line groups is electrically connected to another one of the heating bonding terminals: the first heating line group, the second heating line group, two of the third heating line groups and two of the heating bonding terminals are configured to form a first closed loop.

In some embodiments of the present application, the display panel further includes at least one electronic static discharge unit located in the peripheral area, and one of the first closed loops is electrically connected to at least one of the electronic static discharge units.

In some embodiments of the present application, the display panel further includes a plurality of first fan-out lines and a plurality of second fan-out lines located in the second peripheral sub-area, the first fan-out line being electrically connected to the data line, and the second fan-out line being electrically connected to the third heating line group and the heating bonding terminal respectively: an orthographic projection of the first fan-out line on the substrate at least partially overlaps with an orthographic projection of the second fan-out line on the substrate.

In some embodiments of the present application, the display panel is electrically connected to a flexible circuit board and at least one driver chip: the display panel further includes a plurality of display bonding terminals located in the second peripheral sub-area, in a plane parallel to the substrate, a minimum distance from each of the display bonding terminal to the display area is greater than a minimum distance from the driver chip to the display area: the data line is electrically connected to the driver chip through the first fan-out line, and the driver chip is electrically connected to the flexible circuit board through the display bonding terminal; the heating bonding terminals are arranged in a same row, and the display bonding terminals are arranged in a same row, and a minimum distance between the heating bonding terminals and the edge of the display panel is equal to a minimum distance between the display bonding terminals and the edge of the display panel.

In some embodiments of the present application, each of the display bonding terminals and each of the heating bonding terminals have a same structure, and are all electrically connected to the same flexible circuit board.

In some embodiments of the present application, the heating bonding terminals include a first part and a second part, and all of the display bonding terminals are located in an area between the first part and the second part.

In some embodiments of the present application, the display bonding terminals include a first part and a second part: all of the heating bonding terminals are located in an area between the first part and the second part: or some heating bonding terminals are located in the area between the first part and the second part, some other heating bonding terminals are located in an area on a side of the first part facing away from the second part, some other heating bonding terminals are located in an area on a side of the second part facing away from the first part.

In some embodiments of the present application, the display panel further includes a test unit located in the second peripheral sub-area, an orthographic projection of the test unit on the substrate does not overlap with the orthographic projections of the first fan-out line and the second fan-out line on the substrate: the heating bonding terminals located in the area between the first part and the second part comprise a first group and a second group, and the test unit is located in an area between the first group and the second group.

In some embodiments of the present application, the display panel further includes a plurality of dummy heating terminals located in the second peripheral sub-area, the dummy heating terminals are arranged in a same row, and are located on a side of the test unit facing away from the display area: a minimum distance between each of the dummy heating terminals and the edge of the display panel is equal to the minimum distance between each of the heating bonding terminals and the edge of the display panel, and each of the dummy heating terminals is electrically connected to the flexible circuit board.

In some embodiments of the present application, the display panel further includes at least one fourth heating line located in the peripheral area, the fourth heating line is disposed around all of the first heating lines, the second heating lines and the third heating lines: a part of the fourth heating line arranged in the first peripheral sub-area is located on a side of the second heating lines facing away from the display area, a part of the fourth heating line arranged in the second peripheral sub-area is located on a side of the second fan-out lines facing away from the display area, an orthographic projection of the fourth heating line on the substrate at least partially overlaps with the orthographic projection of the first fan-out line on the substrate: one end of the fourth heating line is connected to one of the heating bonding terminals, the other end of the fourth heating line is connected to another one of the heating bonding terminals, the fourth heating wire and two of the heating bonding terminals are configured to form a second closed loop.

In some embodiments of the present application, the display panel includes one among the fourth heating lines located in the peripheral area, except for a part of the fourth heating line arranged in the second peripheral sub-area, a line width of other parts of the fourth heating line is larger than a line width of the first heating line, the line width of other parts of the fourth heating line is greater than a line width of the second heating line, the line width of other parts of the fourth heating line is greater than a line width of the third heating line: or the display panel further includes a plurality of fourth heating lines located in the peripheral area, and the plurality of fourth heating lines are arranged in parallel.

In a second aspect, an embodiment of the present application provides a display device, including a flexible circuit board, at least one driver chip and the display panel described in the first aspect, and the display panel is electrically connected to the flexible circuit board and the driver chip respectively.

The above description is only a summary of solutions of the present disclosure. In order to learn technical means of the present disclosure more clearly and allow the technical means to be implemented based on the disclosure of the description, and in order to make the above and other objects, features and advantages of the present disclosure more apparent and understandable, specific embodiments of the present disclosure are illustrated below.

BRIEF DESCRIPTION OF THE DRAWINGS

In order to clearly explain technical solutions of embodiments of the present disclosure or the related art, drawings required in the description of the embodiments or the related art are briefly introduced below. Apparently, the drawings in the following description are only some embodiments of the present disclosure. For those skilled in the art, other drawings can be obtained based on these drawings without paying creative work.

DETAILED DESCRIPTION

The technical solutions of the embodiments of the present application will be described below with reference to the accompanying drawings of the embodiments of the present application. Apparently, only a part of the embodiments, not all the embodiments of the present application, are described. All other embodiments obtained, based on the embodiments described in the present application, by those skilled in the art without paying creative efforts shall fall within the protection scope of the present application.

In the drawings, the thicknesses of regions and layers may be exaggerated for clarity. The same reference numerals in the drawings denote the same or similar structures, and thus detailed descriptions thereof will be omitted. In addition, the drawings are merely schematic illustrations of the present disclosure and are not necessarily drawn to scale.

The term "comprising" throughout the description and claims is interpreted in an open and inclusive sense, i.e., "including, but not limited to", unless it is otherwise specified in the context. In the description of the specification, the terms such as "an embodiment", "some embodiments", "exemplary embodiments", "example", "specific examples" or "some examples" are intended to indicate that particular features, structures, materials, or properties related to the embodiment or example are included in at least one embodiment or example of the present application. Schematic representations of the above terms are not necessarily referring to the same embodiment or example. Further, the particular features, structures, materials or characteristics described may be included in any suitable manner in any one or more embodiments or examples.

Liquid crystal displays (LCD) are often used in relatively extreme environments, such as a low-temperature environment, which requires liquid crystal displays to be able to display normally in these extreme environments. However, affected by the properties of the liquid crystal itself, the viscosity coefficient of the liquid crystal is too large in a low temperature environment, resulting in a significantly longer response time of the liquid crystal compared to the normal temperature environment, further resulting in a visual ghosting, especially when the temperature is low and near the crystallization temperature of the liquid crystal, the display quality of the liquid crystal display is greatly affected. In order to broaden the application range of liquid crystal displays, a key to solve this problem is to develop a heating technology of liquid crystal in the cell under the low temperature environment.

Figure 1A:
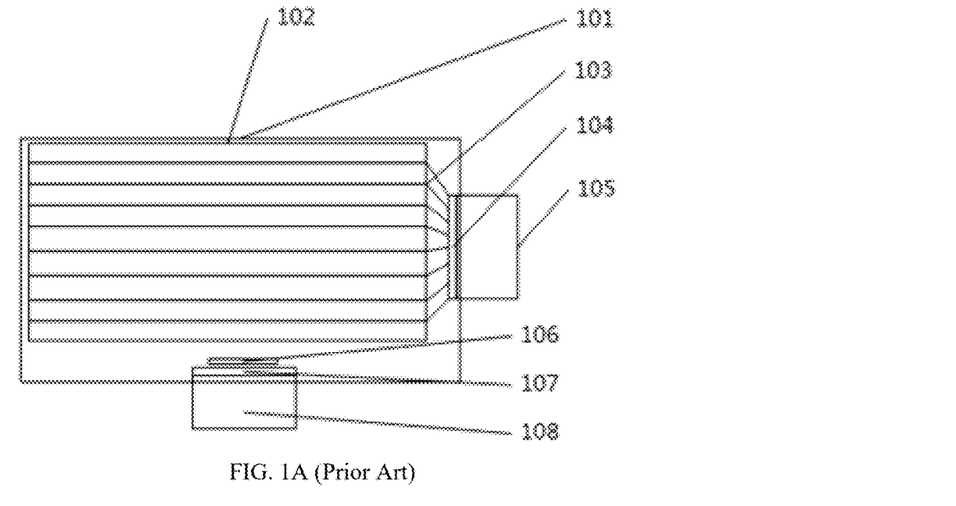
FIG. 1A is a schematic structural diagram illustrating a display devices in related art.
Figure 1B:
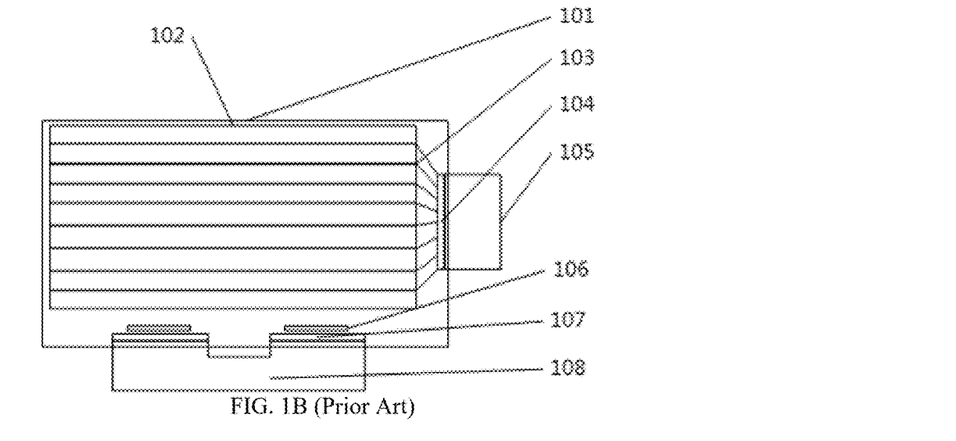
FIG. 1B is a schematic structural diagram illustrating another display device in related art
Figure 2:
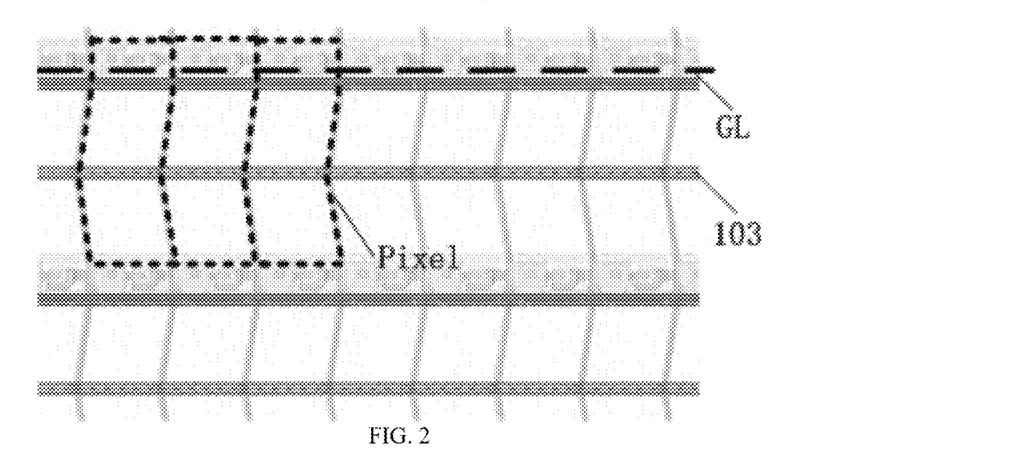
FIG. 2 is structural schematic diagram illustrating a display panel in the related art.
Figure 3:
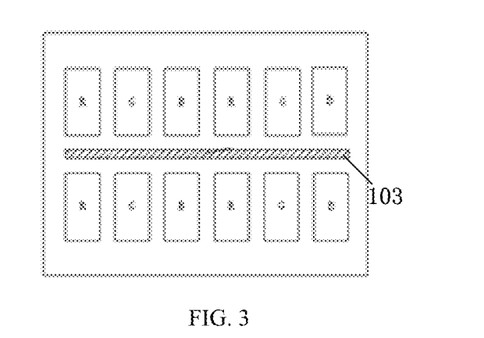
FIG. 3 is a structural schematic diagram illustrating another display panel in the related art.

In the related art, heating lines are provided in the liquid crystal display, and an external flexible printed circuit (FPC) for controlling heating signals is connected to input signals into the heating lines, so that the purpose of heating the panel in a low temperature environment by heat generated by the heating lines is realized. As shown in FIG. 1A and FIG. 1B, reference sign 101 denotes a substrate of the display panel, reference sign 102 denotes an edge of the display area, reference sign 103 denotes heating lines, reference sign 104 denotes a chip on film (COF) for heating, and reference sign 105 denotes a FPC for heating, reference sign 106 denotes a driver chip (IC) for display, reference sign 107 denotes bonding terminals of a FPC for display, and reference sign 108 denotes the FPC for display. As shown in FIG. 1A. FIG. 2 and FIG. 3, the heating lines in the related art are arranged along a direction parallel to the gate line (GL), and extend from the display area to the peripheral area. Accordingly, the bonding terminals of the FPC for heating are also provided on the left side or the right side of the display panel. However, the bonding terminals 107 of the FPC for display are generally provided on the lower side of the display panel. In order to achieve normal display and meet the heating requirements in the liquid crystal cell, two dedicated FPCs, the FPC for display and the FPC for heating, need to be bonded at the same time for supplying power, which increases the production cost and process complexity, and the bonding of the heating lines requires to additionally reserve a larger bezel.

Figure 4:
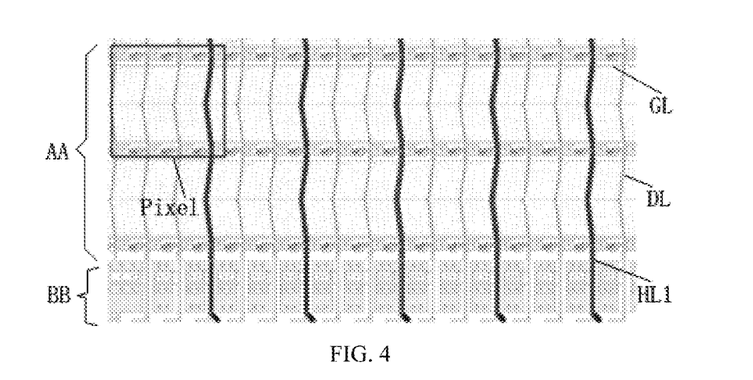
FIG. 4 is a schematic structural diagram illustrating a display panel provided by embodiments of the present application.
Figure 5:
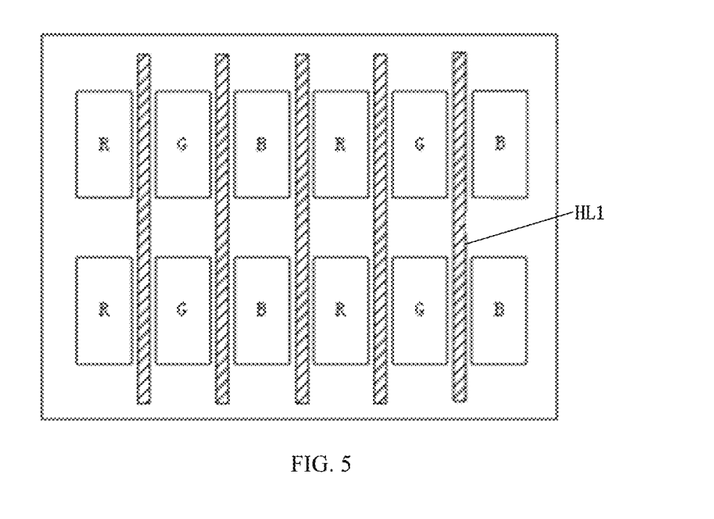
FIG. 5 is a schematic structural diagram illustrating another display panel provided by embodiments of the present application.
Figure 6:
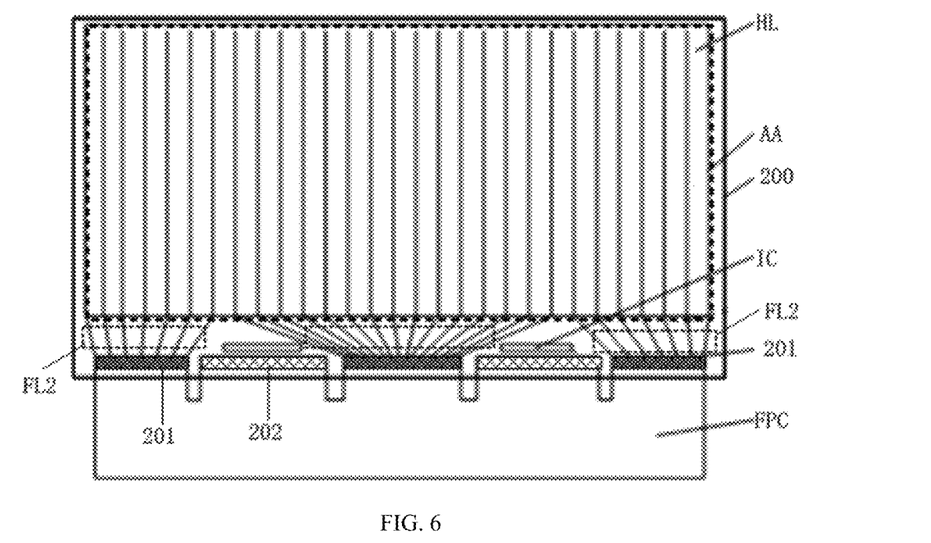
FIG. 6 is a schematic structural diagram illustrating a display device provided by embodiments of the present application.
Figure 7:
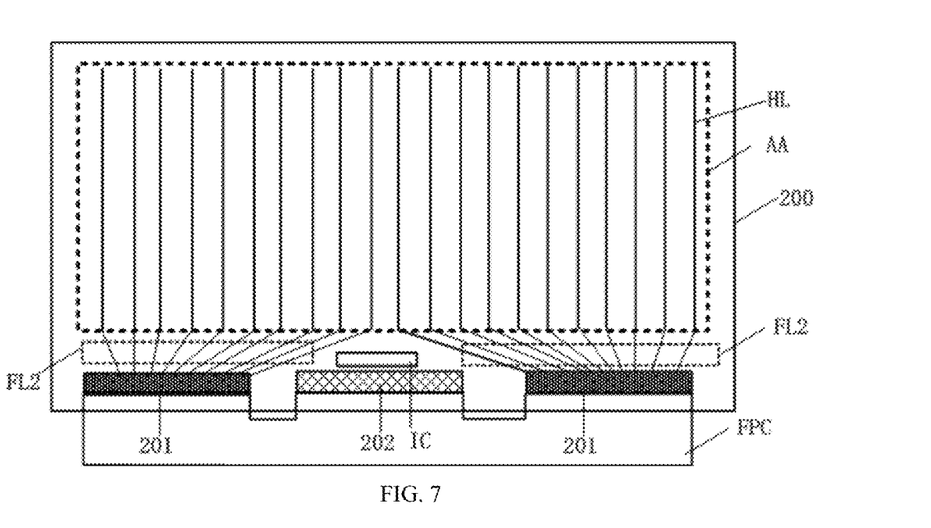
FIG. 7 is a schematic structural diagram illustrating another display device provided by embodiments of the present application.
Figure 8:
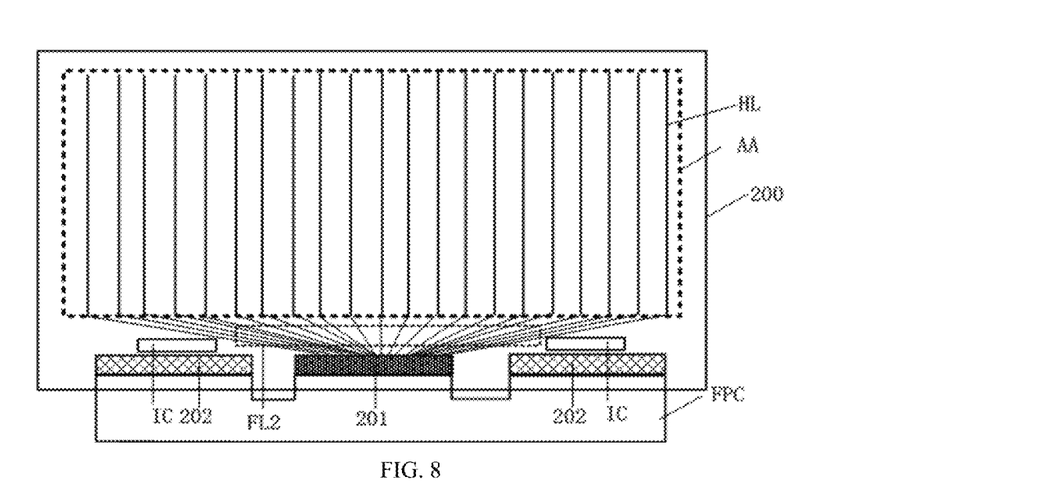
FIG. 8 is a schematic structural diagram illustrating another display device provided by embodiments of the present application.

In view of the above, an embodiment of the present application provides a display panel, as shown in FIG. 4. FIG. 5. FIG. 6. FIG. 7 and FIG. 8, including:

a substrate 200, including a display area AA and a peripheral area surrounding the display area AA;

a first conductive layer, located on a side of the substrate 200, including a plurality of data lines DL located in the display area AA; and a second conductive layer, located on a side of the first conductive layer facing away from the substrate 200, including at least one first heating line group, where the first heating line group includes at least one first heating line HL1, the first heating line HL1 extends to the peripheral area from the display area AA, and an extending direction of the first heating line HL1 is the same as that of the data line DL.

The display panel is a liquid crystal display (LCD) display panel, and the liquid crystal display panel includes an array substrate, a color filter substrate, and a liquid crystal layer located between the array substrate and the color filter substrate.

It should be noted that the aforementioned substrate 200 refers to the substrate of the array substrate.

Exemplarily, the substrate 200 may be a rigid substrate, such as glass.

The material of the first conductive layer is a conductive material, for example, the conductive material can be a metal material. The metal material can include at least one of copper (Cu), aluminum (Al), molybdenum (Mo), and titanium (Ti), or a combination thereof.

In some embodiments, the first conductive layer can be called as a source-drain metal layer (SD layer), and can be used to form the data line DL and a source electrode and a drain electrode of a transistor.

The material of the second conductive layer is a conductive material, for example, the conductive material can be a metal material. The metal material can include at least one of copper (Cu), aluminum (Al), molybdenum (Mo), and titanium (Ti), or a combination thereof.

Here, there is no limitation as to whether the materials of the first conductive layer and the second conductive layer are the same.

In some embodiments, the material of the second conductive layer can be selected from materials with better thermal effects, that is, the material of the second conductive layer can be selected from materials that are prone to heat under the action of electrical signals.

The specific position of the first heating line HL1 is not limited here.

Exemplarily, the first heating line HL1 may be located in an area above a sub-pixel between two adjacent data lines DL, and overlap with an orthographic projection of the sub-pixel on the substrate 200.

Figure 9:
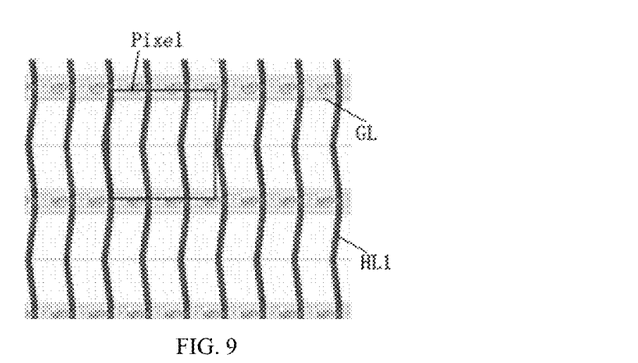
FIG. 9 is a schematic structural diagram illustrating another display panel provided by embodiments of the present application.

Exemplarily, as shown in FIG. 4, the first heating line HL1 is located between adjacent pixel units: or, as shown in FIG. 5 and FIG. 9, the first heating line HL1 is located between two adjacent sub-pixels.

In this case, the orthographic projection of the first heating line HL1 on the substrate 200 does not overlap with the orthographic projection of each sub-pixel on the substrate 200. In this case, the first heating line HL1 has little influence on the aperture ratio of the display panel, which can ensure a higher transmissivity of the display panel, improve display effect, and reduce power consumption.

The number of the first heating line groups and the number of the first heating lines HL1 included in each first heating line group are not limited here, and may be specifically determined according to the temperature of the application environment of the display panel.

Exemplarily, as shown in FIG. 4, one first heating line HL1 can be provided between every two adjacent pixel units. One pixel unit shown in FIG. 4 includes three sub-pixels.

Exemplarily, as shown in FIG. 5 or FIG. 9, one first heating line HL1 can be provided between every two adjacent sub-pixels.

Figure 10:
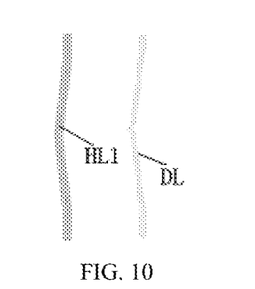
FIG. 10 is a schematic structural diagram illustrating a first heating line and a data line provided by embodiments of the present application.

The shape of the orthographic projection of the first heating line HL1 on the substrate 200 is not limited here. Exemplarily, when the first heating line HL1 is located between adjacent pixel units, or the first heating line HL1 is located between two adjacent sub-pixels, the shape of the orthographic projection the first heating line HL1 on the substrate 200 may be similar to the shape of the orthographic projection of the data line DL on the substrate 200, as shown in FIG. 10.

In the embodiment of the present application, the first heating line HL1 is arranged along the extending direction of the data line DL. Thus, in the subsequent process, when bonding the FPC for heating, the FPC for heating and the FPC for display (the FPC electrically connected to the data line) can be arranged on the same side of the display panel, so that the bonding area of the FPC for heating and the bonding area of the FPC for display are common. In this way, the design space of the peripheral area of the display panel can be largely saved while improving abnormal display of the liquid crystal display panel in a low-temperature environment, thereby facilitating the preparation of narrow bezel display products.

In some embodiments of the present application, as shown in FIG. 4 and FIG. 9, the orthographic projection of the first heating line HL1 on the substrate 200 at least partially overlaps with the orthographic projection of the data line DL on the substrate 200.

The at least partially overlapping between the orthographic projection of the first heating line HL1 on the substrate 200 and the orthographic projection of the data line DL on the substrate 200 includes but not limited to the following situations:

First, the orthographic projection of the first heating line HL1 on the substrate 200 partially overlaps with the orthographic projection of the data line DL on the substrate 200;

Second, the orthographic projection of the first heating line HL1 on the substrate 200 entirely overlaps with the orthographic projection of the data line DL on the substrate 200.

In the embodiment of the present application, the orthographic projection of the first heating line HL1 on the substrate 200 is arranged to at least partially overlap with the orthographic projection of the data line DL on the substrate 200, so that it can largely ensure that the aperture ratio of the display panel is not reduced as much as possible after the first heating line HL1 is arranged, while improving the display abnormality of the liquid crystal display panel in a low-temperature environment. The negative impact on the transmissivity of the display panel after providing the first heating line HL1 is avoided as much as possible, so as to ensure the transmissivity of the display panel, thereby improving the display effect.

In some embodiments of the present application, the display panel includes a black matrix layer BM located on a side of the second conductive layer facing away from the substrate 200; the orthographic projection of a part of the first heating line HL1, located in the display area AA, on the substrate 200 is located within the orthographic projection of the black matrix layer on the substrate 200, and the orthographic projection of the data line DL on the substrate 200 is located within the orthographic projection of the black matrix layer BM on the substrate 200.

It should be noted that, in a liquid crystal display panel, the black matrix layer BM is generally disposed on the color filter substrate. After box aligning the array substrate and the color filter substrate, the black matrix layer BM is located on the side of the second conductive layer facing away from the substrate 200 of the array substrate. The black matrix layer BM has a light-shielding or light-absorbing effect.

The orthographic projection of a part of the first heating line HL1, located in the display area AA, on the substrate 200 is located within the orthographic projection of the black matrix layer on the substrate 200 as follows: a contour of the orthographic projection of the part of the first heating line HL1, located in the display area AA, on the substrate 200 is located within a contour of the orthographic projection of the black matrix layer BM on the substrate 200; or, the contour of the orthographic projection of the part of the first heating line HL1, located in the display area AA, on the substrate 200 overlaps with the contour of the orthographic projection of the black matrix layer BM on the substrate 200.

Similarly, the orthographic projection of the data line DL on the substrate 200 is located within the orthographic projection of the black matrix layer BM on the substrate 200 as follows: a contour of the orthographic projection of the data line DL on the substrate 200 is located within the contour of the orthographic projection of the black matrix layer BM on the substrate 200; or, the contour of the orthographic projection of the data line DL on the substrate 200 overlaps with the contour of the orthographic projection of the black matrix layer BM on the substrate 200.

In practical applications, in order to prevent the first heating line HL1 and the data line DL from reflecting the light in the display panel to increase the reflectivity of the display panel, the orthographic projections of the first heating line HL1 and the data line DL on the substrate 200 are arranged to be located within the orthographic projection of the black matrix layer BM on the substrate 200.

It should be noted that the higher the reflectivity of the display panel, the more likely specular reflection occurs on the display surface of the display panel, and shadows of environmental objects are projected, thereby reducing the display effect.

In addition, considering that there is refraction and scattering of light besides the reflection of light between the film layers of the display panel, the contour of the orthographic projection of the data line DL on the substrate 200 is arranged to be located within the contour of the orthographic projection of the black matrix layer BM on the substrate 200, and the contour of the orthographic projection of the part of the first heating line HL1, located in the display area AA, on the substrate 200 is arranged to be located within the contour of the orthographic projection of the black matrix layer BM on the substrate 200. In this way, the reflection effect of the data line DL and the first heating line HL1 on the display light can be better reduced, the reflectivity of the display panel can be reduced, and the display effect can be improved.

In some embodiments of the present application, the orthographic projection of the part of the first heating line HL1, located in the display area AA, on the substrate 200 is within the orthographic projection of the data line DL on the substrate 200.

In exemplary embodiments of the present application, the orthographic projection of the part of the first heating line HL1, located in the display area AA, on the substrate 200 is within the orthographic projection of the data line DL on the substrate 200 in the following manners: the contour of the orthographic projection of the part of the first heating line HL1, located in the display area AA, on the substrate 200 is located within the contour of the orthographic projection of the data line DL on the substrate 200; or, the contour of the orthographic projection of the part of the first heating line HL1, located in the display area AA, on the substrate 200 overlaps with the contour of the orthographic projection of the data line DL on the substrate 200.

In practical applications, the orthographic projection of the part of the first heating line HL1, located in the display area AA, on the substrate 200 is arranged to be within the orthographic projection of the data line DL on the substrate 200. In this way, the influence of the part of the first heating line HL1 located in the display area AA on the aperture ratio of the display area AA can be almost avoided, thereby ensuring a higher transmissivity in the display area AA of the display panel, and improving the display effect of the display panel.

Figure 11:
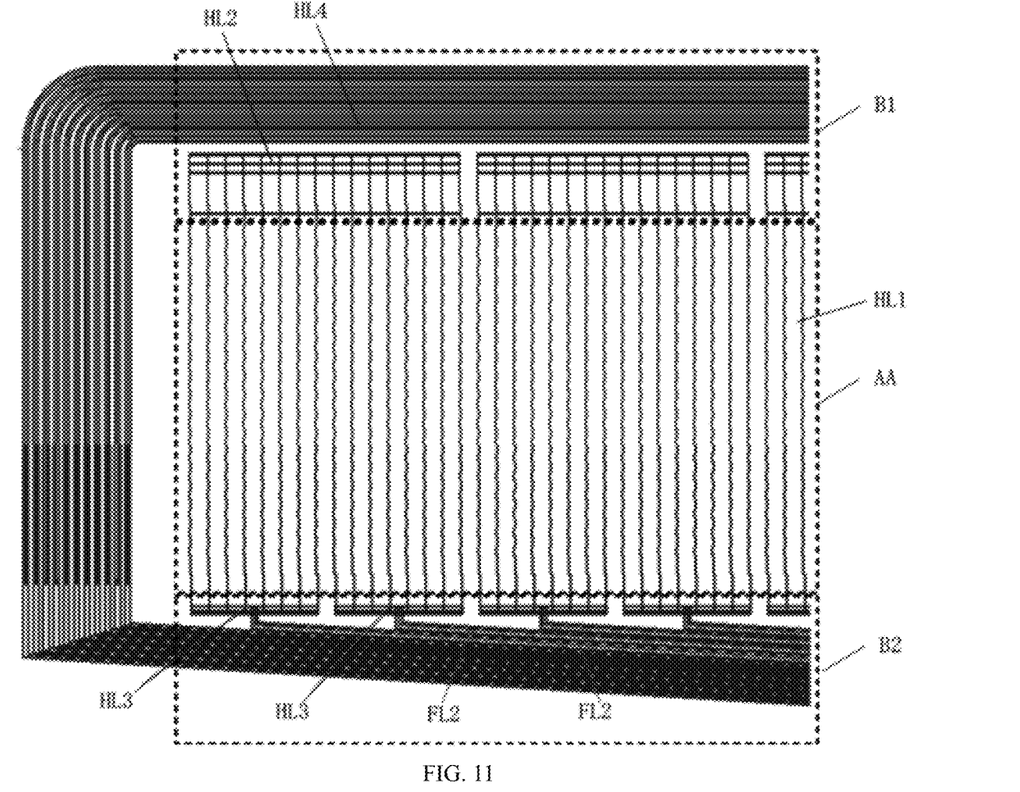
FIG. 11 is a schematic diagram illustrating arrangement of heating lines in the display panel provided by embodiments of the present application.

In some embodiments of the present application, as shown in FIG. 11, the peripheral area further includes a first peripheral sub-area B1 and a second peripheral sub-area B2, and the first peripheral sub-area B1 and the second peripheral sub-area B2 are located on opposite sides of the display area AA.

The second conductive layer further includes at least one second heating line group located in the first peripheral sub-area B1, and the second heating line group includes at least one second heating line HL2.

Each first heating line HL1 in the same first heating line group intersects and connects with various second heating lines HL2 in one second heating line group.

Figure 12:
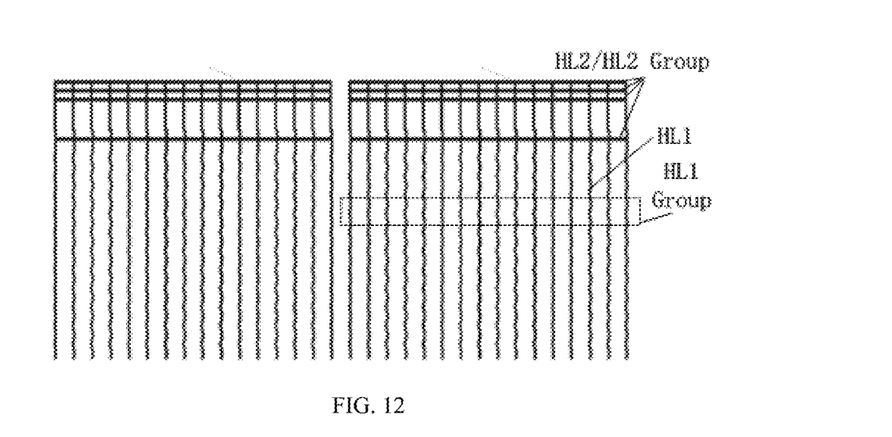
FIG. 12 is a schematic diagram illustrating an arrangement of first heating lines and second heating lines provided by embodiments of the present application.

Here, there is no limitation on an angle formed after the first heating line HL1 intersects with the second heating line HL2. Exemplarily, as shown in FIG. 11 and FIG. 12, the first heating line HL1 intersects with and is perpendicular to the second heating line HL2.

In an exemplary embodiment, the second peripheral sub-area B2 includes a bonding area and a fan-out area, and the fan-out area is located between the bonding area and the display area. At least fan-out traces of various signal lines are arranged in the fan-out area.

In an exemplary embodiment, the number of the second heating line groups is the same as the number of the first heating line groups.

Figure 13:
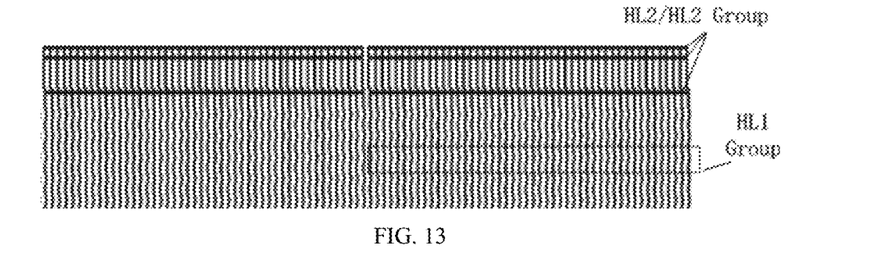
FIG. 13 is a schematic diagram illustrating an arrangement of first heating lines and second heating lines provided by embodiments of the present application.

Exemplarily. FIG. 12 and FIG. 13 respectively show two first heating line groups (HL1 Group) and two second heating line groups (HL2 Group).

Figure 14:
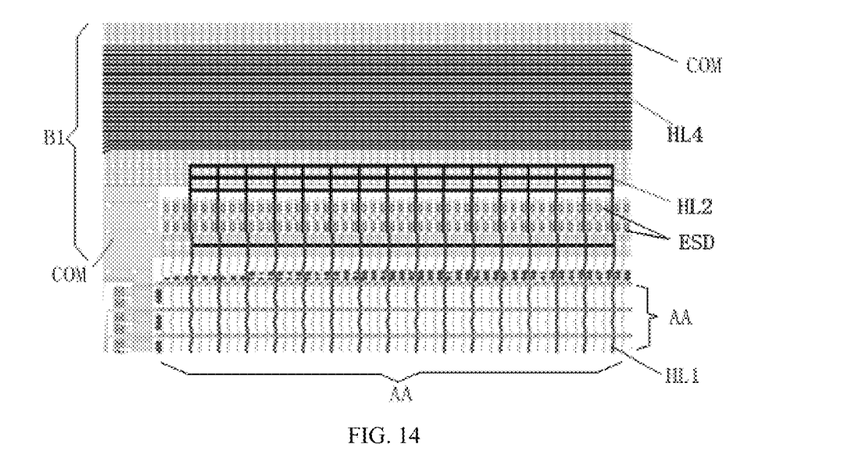
FIG. 14 is a schematic diagram illustrating arrangement of heating lines in a display area and a first peripheral sub-area of the display panel provided by embodiments of the present application.

In FIG. 12, one first heating line group (HL1 Group) includes 16 first heating lines HL1, and one second heating line group (HL2 Group) includes 4 second heating lines HL2. As shown in FIG. 12 and FIG. 14, the closer the second heating line HL2 is arranged to the display area AA, the more favorable it is to increase the temperature in the display panel, thereby improving the abnormal display caused by viscosity deterioration of liquid crystal due to the low-temperature.

In FIG. 13, one first heating line group (HL1 Group) includes 32 first heating lines HL1, and one second heating line group (HL2 Group) includes 3 second heating lines HL2.

The number of the first heating lines HL1 included in the same first heating line group can be adjusted according to the actual design. Generally, the number of first heating lines HL1 included in the same first heating line group is determined by the size of the design space of the second peripheral sub-area B2.

Exemplarily, the more the number of first heating lines HL1 included in the same first heating line group, when the first heating lines HL1 are electrically connected to the heating bonding terminals through the fan-out traces in the second peripheral sub-area B2, since the first heating lines HL1 included in the same first heating line group are arranged in parallel, the number of fan-out traces can be reduced, thereby saving the design space of the second peripheral sub-area B2.

In practical applications, as shown in FIG. 14, the first peripheral sub-area B1 is provided with a plurality of electronic static discharge units ESD on a side close to the display area AA. Accordingly, the part of the first heating line HL1 located in the first peripheral sub-area B1 passes between two adjacent ESD units, and the second heating line HL2 also needs to avoid the area where the ESD units are arranged. Therefore, when the number of the second heating lines HL2 included in the second heating line group is greater than or equal to 2, some second heating lines HL2 in the second heating line group are disposed on a side of an area, where the ESD units are located, facing away from the display area AA, the other second heating lines HL2 in the second heating line group are disposed on a side of the area, where the ESD units are located, close to the display area AA.

In an exemplary embodiment, as shown in FIG. 14, the orthographic projection of the second heating line HL2 in the second heating line group, disposed on a side of the area where the ESD units are located facing away from the display area AA, on the substrate 200 at least partially overlaps with the orthographic projection of the Com signal line on the substrate 200.

Exemplarily, the Com signal line at least includes a line segment located in the gate layer and a line segment located in the source-drain metal layer. The line segment of the Com signal line located in the gate layer has a block structure or a grid structure as shown in FIG. 14.

The orthographic projection of the second heating line HL2 in the second heating line group, disposed on a side of the area where the ESD units are located facing away from the display area AA, on the substrate 200 at partially overlaps with the orthographic projection of the line segment of the Com signal line located in the gate layer on the substrate 200.

It should be noted that, in this application, the relevant description involving "one part, another part" is not limited to include only two parts, but may also include a third part and a fourth part, which can be determined according to the actual situation, and are explained here.

Figure 15:
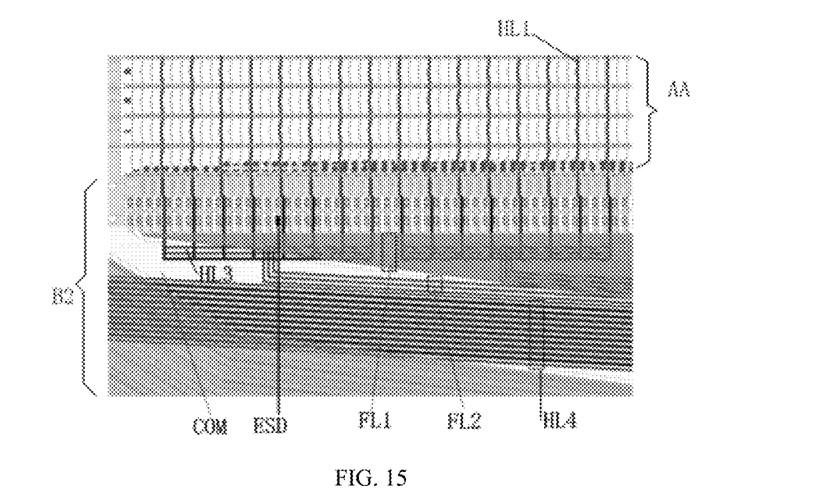
FIG. 15 is a schematic diagram illustrating arrangement of heating lines in a display area and a second peripheral sub-area of the display panel provided by embodiments of the present application.

In some embodiments of the present application, as shown in FIG. 11 and FIG. 15, the second conductive layer further includes at least two third heating line groups located in the second peripheral sub-area B2, and the third heating line group includes at least one third heating line HL3: the number of the third heating line groups is twice the number of the second heating line groups.

Some first heating lines in the same first heating line group intersect and connect with each third heating line in a third heating line group, and the other first heating lines in the same first heating line group intersect and connect with each third heating line in another third heating line group.

In an exemplary embodiment, the third heating line group includes a plurality of third heating lines HL3. In this way, the load of the third heating line group can be reduced, the electrical conductivity thereof can be improved, and the transmission of electric signals can be facilitated.

In an exemplary embodiment, as shown in FIG. 15, one first heating line group and two third heating line groups are shown, where the first heating line group includes 16 first heating lines HL1, and each third heating line group includes three third heating lines HL3. Half of the first heating lines HL1 in the first heating line group intersect and connect with one of the third heating line groups, and the other half of the first heating lines HL1 in the first heating line group intersect an connect with the other one of the third heating line groups.

In an exemplary embodiment, a plurality of electronic static discharge units ESD are also provided on a side of the second peripheral sub-area B2 close to the display area AA, as shown in FIG. 15, each third heating line HL3 is located on a side of an area, where the electronic static discharge units ESD are located, facing away from the display area AA.

In an exemplary embodiment, some third heating lines in the same third heating line group can be arranged on a side of an area, where the electronic static discharge units ESD are located, facing away from the display area AA, and the other third heating lines in the same third heating line group can be arranged on a side of the area, where the electronic static discharge units ESD are located, close to the display area AA.

Figure 16:
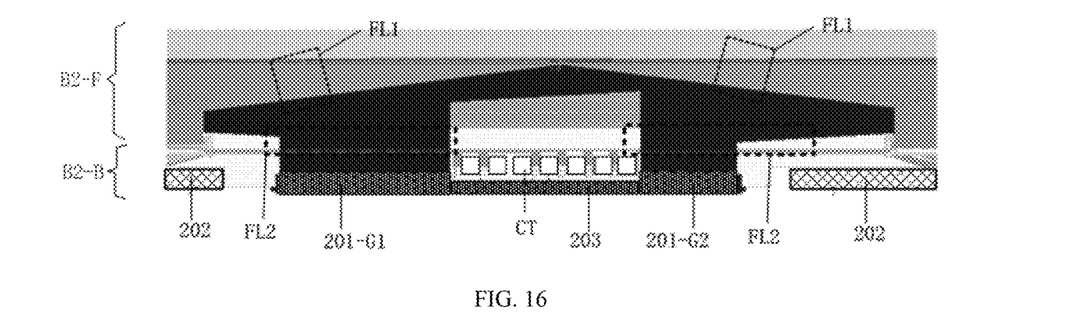
FIG. 16 is a schematic structural diagram of the second peripheral sub-region of the display panel provided by embodiments of the present application.
Figure 17:
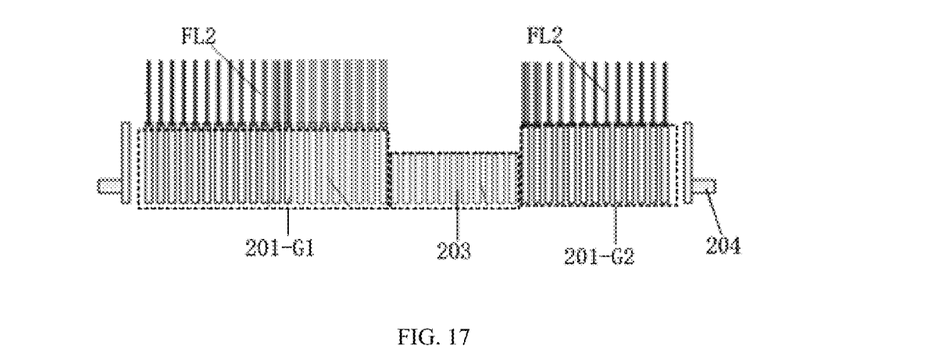
FIG. 17 is an enlarged view of an area in FIG. 16 where heating bonding terminals are located.

In some embodiments of the present application, as shown in FIG. 16 and FIG. 17, the display panel further includes at least two heating bonding terminals 201 located in the second peripheral sub-area B2, one of the third heating line groups is electrically connected to one of the heating bonding terminals 201, and the other one the third heating line groups is electrically connected to the other heating bonding terminal 201. The first heating line group, the second heating line group, the two third heating line groups and the two heating bonding terminals are configured to form a first closed loop. FIG. 17 is an enlarged view of an area where the bonding terminals are located in FIG. 16.

In exemplary embodiments, the heating lines inside the display panel are all connected in parallel. Therefore, under the same applied voltage V, the resistance of the heating lines connected in parallel is smaller. According to the power formula. W=V2/R, the smaller the internal resistance R of the display panel, the greater the power W generated on the panel, and the greater electric power is conducive to the temperature rise of the display panel in a low temperature environment, and the rise rate of the temperature is also faster.

In practical applications, the heating lines in the first closed loop are driven to generate heat by respectively applying positive and negative voltages to the two heating bonding terminals of the first closed loop.

In some embodiments of the present application, the display panel further includes at least one electronic static discharge unit ESD located in the peripheral area, and the first closed loop is electrically connected to the at least one electronic static discharge unit ESD.

In an exemplary embodiment, the display panel includes a plurality of electronic static discharge units ESD located in the peripheral area, and the specific arrangement positions of the electronic static discharge units ESD in the peripheral area are not limited here.

Exemplarily, as shown in FIG. 14, some electronic static discharge units ESD may be disposed in the first peripheral sub-area B1.

Exemplarily, as shown in FIG. 15, some electronic static discharge units ESD may be disposed in the second peripheral sub-area B2.

In some embodiments of the present application, as shown in FIG. 15, FIG. 16 and FIG. 17, the display panel further includes a plurality of first fan-out lines FL1 and a plurality of second fan-out lines FL2 located in the second peripheral sub-area B2. The first fan-out lines FL1 are electrically connected to the data lines DL, and the second fan-out lines FL2 are electrically connected to each third heating line HL3 in the third heating line group and the heating bonding terminals 201.

As shown in FIG. 15, the orthographic projection of the first fan-out line FL1 on the substrate 200 at least partially overlaps with the orthographic projection of the second fan-out line FL2 on the substrate 200.

In an exemplary embodiment, as shown in FIG. 16, the second peripheral sub-area B2 includes a bonding area B2-B and a fan-out area B2-F. The first fan-out lines FL1 and the second fan-out lines FL2 are all located in the fan-out area B2-F, and each of the heating bonding terminals 201 is located in the bonding area B2-B.

In an exemplary embodiment, the first fan-out lines FL1 may be located in the first conductive layer, for example, the first fan-out lines FL1 may be located in the source-drain metal layer, and the second fan-out lines FL2 are located in the second conductive layer.

In an exemplary embodiment, the second fan-out lines FL2 also have a heating function.

It can be understood that in the embodiments of the present application, "located in a certain layer" refers to being included in the layer, for example, the first fan-out lines FL1 may be located in the source-drain metal layer, which means that the source-drain metal layer includes the first fan-out lines FL1. Other related descriptions are similar to that described here.

In an exemplary embodiment, the display panel may further include a third conductive layer. The third conductive layer is located between the first conductive layer and the substrate 200, and the third conductive layer is generally used to form gate lines GL and gate electrodes of transistors.

In some embodiments, the first fan-out lines FL1 can be located in the third conductive layer.

In some other embodiments, some of the first fan-out lines FL1 are located in the first conductive layer, and some of the first fan-out lines FL1 are located in the third conductive layer.

In some embodiments of the present application, as shown in FIG. 6. FIG. 7 and FIG. 8, the display panel is electrically connected to a flexible circuit board FPC and at least one driver chip IC.

The display panel further includes a plurality of display bonding terminals 202 located in the second peripheral sub-area B2. In a plane parallel to the substrate 200, the minimum distance from each display bonding terminal 202 to the display area AA is greater than the minimum distance from the driver chip IC to the display area AA. The data line DL is electrically connected to the driver chip IC through the first fan-out line FL1, and the driver chip IC is electrically connected to the flexible circuit board FPC through the display bonding terminal 202.

In the plane parallel to the substrate 200, the minimum distance from each display bonding terminal 202 to the display area AA is greater than the minimum distance from the driver chip IC to the display area AA. That is to say, at least some display bonding terminals 202 are located on a side the driver chip IC facing away from the display area AA, and each display bonding terminal 202 is used to electrically connect the driver chip IC to the flexible circuit board FPC, that is, the display bonding terminals 202 involved in the embodiment of the present application refer to display binding terminals for bonding the flexible circuit board FPC.

In practical applications, the display panel further includes display bonding terminals for bonding the driver chip IC to the first fan-out lines FL1. Generally, the orthographic projections of such display bonding terminals on the substrate 200 overlap with the orthographic projections of the driver chip ICs on the substrate 200.

In an exemplary embodiment, as shown in FIG. 6. FIG. 7. FIG. 8. FIG. 16 and FIG. 17, the heating bonding terminals 201 are arranged in the same row, the display bonding terminals 202 are arranged in the same row, and the minimum distance between the heating bonding terminal 201 and the edge of the display panel is equal to the minimum distance between each display bonding terminal 202 and the edge of the display panel.

In an exemplary embodiment, the distance between two adjacent heating bonding terminals 201 is the same, and the distance between two display bonding terminals 202 is the same.

In some embodiments, the display bonding terminals 202 are electrically connected to one flexible circuit board FPC, the heating bonding terminals 201 are electrically connected to another flexible circuit board FPC, and two flexible circuit boards FPC with different functions are located on the same side of the display panel.

In some embodiments of the present application, each display bonding terminal 202 and each heating bonding terminal 201 have the same structure, and are electrically connected to the same flexible circuit board FPC, that is, each display bonding terminal 202 and each heating bonding terminal 201 share a flexible circuit board FPC.

In the embodiment of the present application, the minimum distance between each heating bonding terminal 201 and the edge of the display panel is set to be equal to the minimum distance between each display bonding terminal 202 and the edge of the display panel, and the display bonding terminals 202 and the heating bonding terminal 201 have the same structure, and share one flexible circuit board FPC. Therefore, the integrated bonding of the heating bonding terminals 201 and the display bonding terminals 202 can be realized, which saves one flexible circuit board FPC, reduces the difficulty of the bonding process, saves the space for bonding in the peripheral area of the display panel, and reduces the manufacturing cost of the display panel. It is also conducive to the preparation of display products with narrow bezel while improving the internal heating efficiency of the display panel.

It should be noted that, compared with that the heating line is arranged to be parallel to the gate line GL in the related art, in the embodiments of the present application, the first heating line HL1 is arranged to be parallel to the data line DL. Therefore, in practical application, the arrangement density of the first heating lines HL1 can be increased to a certain extent, thereby improving the heating efficiency of the heating lines to the display panel, increasing the temperature rise rate, and increasing the quick response rate of the liquid crystal in a low temperature environment.

In some embodiments of the present application, as shown in FIG. 7, each heating bonding terminal 201 includes a first part and a second part, and all display bonding terminals 202 are located in an area between the first part and the second part.

In an exemplary embodiment, as shown in FIG. 7, the display panel includes a driver chip IC, the driver chip IC is located in the central area of the second peripheral sub-area B2, and the display bonding terminal 202 is located on a side of the driver chip IC facing away from the display area AA. In FIG. 7, the data line DL and the first fan-out line FL1 are not drawn. In practical application, each first fan-out line FL1 and each second fan-out line FL2 intersect and are insulated from each other.

The plurality of heating bonding terminals 201 include a first part located on the left side of all display bonding terminals 202 and a second part located on the right side of all display bonding terminals 202.

In some embodiments, the heating bonding terminals 201 and the display bonding terminals 202 have the same structure, the same size and are arranged in the same row. In this way, it can be realized that the heating bonding terminals 201 and the display bonding terminals 202 as shown in FIG. 7 share the same flexible circuit board FPC.

In an exemplary embodiment, as shown in FIG. 6 or FIG. 8, the display panel includes two driver chip ICs. In this case, the display bonding terminals 202 include two parts, that is, the first part and the second part, one of the driving chips IC is electrically connected to the first part of the display bonding terminal 202, and the other driving chip IC is electrically connected to the second part of the display bonding terminals 202. In FIG. 6 and FIG. 8, the first part of the display bonding terminals 202 may be the display bonding terminals on the left side, and the second part of the display bonding terminals 202 may be the display bonding terminals on the right side.

In some embodiments, as shown in FIG. 8, all heating bonding terminals 201 are located in the area between the first part of the display bonding terminals 202 and the second part of the display bonding terminals 202.

In other embodiments, as shown in FIG. 6, some heating bonding terminals 201 are located in the area between the first part of the display bonding terminals 202 and the second part of the display bonding terminals 202: some heating bonding terminals 201 are located in an area on a side of the first part of the display bonding terminals 202 facing away from the second part of the display bonding terminals 202; and some heating bonding terminals 201 are located in an area on a side of the second part of the display bonding terminals 202 facing away from the first part of the display bonding terminals 202.

In some embodiments of the present application, as shown in FIG. 16, the display panel further includes a cell test unit (CT) located in the second peripheral sub-area B2. The orthographic projection of the CT on the substrate 200 does not overlap with the orthographic projections of the first fan-out line FL1 and the second fan-out line FL2 on the substrate 200.

The heat bonding terminals 201 located in the area between the first part of the display bonding terminals 202 and the second part of the display bonding terminals 202 includes a first group of heat bonding terminals 201-G1 and a second group of heat bonding terminals 201-G2. The CT is located in the area between the first group of heat bonding terminals 201-G1 and the second group of heat bonding terminals 201-G2.

In some embodiments of the present application, as shown in FIG. 16 and FIG. 17, the display panel further includes a plurality of dummy heating terminals 203 located in the second peripheral sub-area B2, and the dummy heating terminals 203 are arranged in the same row and are located on a side of the CT facing away from the display area AA.

The minimum distance between the dummy heating terminals 203 and the edge of the display panel is equal to the minimum distance between the heating bonding terminals 201 and the edge of the display panel, and the dummy heating terminals 203 are all electrically connected to the flexible circuit board FPC.

In an exemplary embodiment, as shown in FIG. 17, the size of each dummy heating terminal 203 along a direction pointing from the display area AA to the second peripheral area B2 is smaller than the size of other heating terminals 201 along the direction pointing from the display area AA to the second peripheral area B2.

In FIG. 17, the display panel also includes bonding mark patterns 204, located on both sides of an area where the heating bonding terminals 201 are located, for alignment when the heating bonding terminals 201 are bound to the flexible circuit board FPC.

In the embodiment of the present application, a row of dummy heating terminals 203 are arranged on a side of the CT facing away from the display area AA, and the minimum distance between the dummy heating terminals 203 and the edge of the display panel is equal to the minimum distance between the heating bonding terminals 201 and the edge of the display panel. In this way, without affecting the normal use of the CT, the blank area between the first group of heating bonding terminals 201-G1 and the second group of heating bonding terminals 201-G2 is connected. During the bonding of the flexible printed circuit board FPC, since the heating bonding terminals 201 are bound to the same flexible printed circuit board FPC, the dummy heating terminals 203 between the first group of heating bonding terminals 201-G1 and the second group of heating bonding terminals 201-G2 are beneficial to the stability of the electrical connection between the heating terminals and the flexible circuit board FPC.

In some embodiments of the present application, as shown in FIG. 11, the display panel further includes at least one fourth heating line HL4 located in the peripheral area, and the fourth heating line HL4 is disposed around all the first heating lines HL1, the second heating lines HL2 and the third heating lines HL3.

As shown in FIG. 11 and FIG. 14, a part of the fourth heating line HL4 arranged in the first peripheral sub-area B1 is located on a side of the second heating lines HL2 facing away from the display area AA. As shown in FIG. 11 and FIG. 15, a part of the fourth heating line HL4 arranged in the second peripheral sub-area B2 is located on a side of the second fan-out lines FL2 facing away from the display area AA. The orthographic projection of the fourth heating lines HL4 on the substrate 200 at least partially overlaps with the orthographic projection of the first fan-out lines FL1 on the substrate 200.

One end of the fourth heating line HL4 is connected to a heating bonding terminal 201, and the other end of the fourth heating line HL4 is connected to another heating bonding terminal 201, and the fourth heating line HL4 and two of the heating bonding terminals 201 are configured to form a second closed loop. Positive and negative voltages are applied in the second closed loop through the two heating bonding terminals 201 to drive the heating lines in the second closed loop to generate heat.

In some embodiments of the present application, the display panel includes a fourth heating line HL4 located in the peripheral area. Except for a part of the fourth heating line HL4 disposed in the second peripheral sub-area B2, other parts of the fourth heating line HL4 has a line width that is greater than the line width of the first heating line HL1, greater than the line width of the second heating line HL2, and greater than the line width of the third heating line HL3.

Alternatively, the display panel further includes a plurality of fourth heating lines HL4 located in the peripheral area, and the plurality of fourth heating lines HL4 are arranged in parallel.

The line width refers to a dimension of the heating line along a direction perpendicular to the extending direction of the heating line.

In an exemplary embodiment, the second closed loop may be electrically connected to at least one electronic static discharge unit ESD.

In the embodiments of the present application, the wiring method of the heating lines is adjusted, so that the display bonding terminals 202 and the heating bonding terminals 201 are arranged on the same side of the display panel, and the bonding terminals electrically connected to the flexible circuit board FPC have the same structure, and the minimum distances between these bonding terminals and the edge of the display panel are the same. In this way, the display bonding terminals 202 and the heating bonding terminals 201 can share the same flexible circuit board FPC, realizing the integrated bonding technology of FPC. Therefore, the bonding process is simplified, the cost of FPC is saved, and it is not necessary to reserve additional space for bonding the heating bonding terminals, realizing the requirement of narrow bezels, and realizes the purpose of heating the panel under a high power.

It should be noted that the display panel may also include other structures, and only the structures related to the creative point are introduced here. Other structures of the liquid crystal display panel can be obtained according to related technologies or common knowledge, and will not be repeated here.

An embodiment of the present application provides a display device, including a flexible circuit board, at least one driver chip, and the display panel as described above, where the display panel is electrically connected to the flexible circuit board and the driver chip, respectively.

For the structure of the display panel, reference may be made to the foregoing description, which will not be repeated here.

In exemplary embodiments, the display device shown in FIG. 7 includes one driver chip IC: the display device shown in FIG. 6 and FIG. 8 includes two driver chip ICs.

In FIG. 6 to FIG. 8, THE display bonding terminals 202 and heating bonding terminals 201 share one flexible circuit board FPC.

The display device is a liquid crystal display device, which can be twisted nematic (TN) liquid crystal display device, vertical alignment (VA) liquid crystal display device, in-plane switching (IPS) liquid crystal display device or advanced super dimension switch (ADS) liquid crystal display device and the like.

The display device may be a display device such as a LCD display, and any product or component having a display function such as a TV, a digital camera, a mobile phone, a tablet computer and the like including such display device. The display device provided by the embodiments of the present application has a high display effect under low temperature conditions, and is suitable for display products with a narrow bezel.

The above are merely exemplary implementations of the present disclosure, but the protection scope of the present disclosure is not limited thereto. Any changes or substitutions easily conceived by those skilled in the art based on the contents of the present disclosure fall within the protection scope of the present disclosure. Therefore, the protection scope of the present disclosure shall be defined by the appended claims.

The invention claimed is:

1. A display panel, comprising:
  a substrate, comprising a display area and a peripheral area surrounding the display area;
  a first conductive layer, located on a side of the substrate and comprising a plurality of data lines located in the display area; and
  a second conductive layer, located on a side of the first conductive layer facing away from the substrate and comprising at least one first heating line group, wherein the first heating line group comprises at least one first heating line, the first heating line extends from the display area to the peripheral area, and extends in a direction same as an extending direction of the data line;
  wherein the peripheral area further comprises a first peripheral sub-area and a second peripheral sub-area located on opposite sides of the display area;
  wherein the second conductive layer further comprises at least one second heating line group located in the first peripheral sub-area, and the second heating line group comprises at least one second heating line;
  wherein each of the first heating lines in the same first heating line group respectively intersects and connects with each of the second heating lines in one of the second heating line groups;
  wherein the second conductive layer further comprises at least two third heating line groups located in the second peripheral sub-area, and each of the third heating line groups comprises at least one third heating line;
  wherein a number of the third heating line groups is twice a number of the second heating line groups;
  some first heating lines in the same first heating line group intersect and connect with each of the third heating lines in one of the third heating line groups, other first heating lines in the same first heating line group intersect and connect with each of the third heating lines in another one of the third heating line groups;
  wherein the display panel further comprises at least two heating bonding terminals located in the second peripheral sub-area, one of the third heating line groups is electrically connected to one of the heating bonding terminals, and another one of the third heating line groups is electrically connected to another one of the heating bonding terminals;
  wherein the first heating line group, the second heating line group, two of the third heating line groups and two of the heating bonding terminals are configured to form a first closed loop;
  wherein the display panel further comprises at least one electronic static discharge unit located in the peripheral area, and one of the first closed loops is electrically connected to at least one of the electronic static discharge units.

2. The display panel according to claim 1, wherein an orthographic projection of the first heating line on the substrate at least partially overlaps with an orthographic projection of the data line on the substrate.

3. The display panel according to claim 2, further comprising a black matrix layer located on a side of the second conductive layer facing away from the substrate,
  an orthographic projection of a part of the first heating line, located in the display area, on the substrate is located within an orthographic projection of the black matrix layer on the substrate, and the orthographic projection of the data line on the substrate is located within the orthographic projection of the black matrix layer on the substrate.

4. The display panel according to claim 3, wherein the orthographic projection of the part of the first heating line, located in the display area, on the substrate is located within the orthographic projection of the data line on the substrate.

5. The display panel according to claim 1, further comprising a plurality of first fan-out lines and a plurality of second fan-out lines located in the second peripheral sub-area, the first fan-out line being electrically connected to the data line, and the second fan-out line being electrically connected to the third heating line group and the heating bonding terminal respectively;
  wherein an orthographic projection of the first fan-out line on the substrate at least partially overlaps with an orthographic projection of the second fan-out line on the substrate.

6. The display panel according to claim 5, wherein the display panel is electrically connected to a flexible circuit board and at least one driver chip;
  wherein the display panel further comprises a plurality of display bonding terminals located in the second peripheral sub-area, in a plane parallel to the substrate, a minimum distance from each of the display bonding terminal to the display area is greater than a minimum distance from the driver chip to the display area; the data line is electrically connected to the driver chip through the first fan-out line, and the driver chip is electrically connected to the flexible circuit board through the display bonding terminal;
  wherein the heating bonding terminals are arranged in a same row, and the display bonding terminals are arranged in a same row, and a minimum distance between the heating bonding terminals and the edge of the display panel is equal to a minimum distance between the display bonding terminals and the edge of the display panel.

7. The display panel according to claim 6, wherein each of the display bonding terminals and each of the heating bonding terminals have a same structure, and are all electrically connected to the same flexible circuit board.

8. The display panel according to claim 7, wherein the heating bonding terminals comprise a first part and a second part, and all of the display bonding terminals are located in an area between the first part and the second part.

9. The display panel according to claim 7, wherein the display bonding terminals comprise a first part and a second part,
  all of the heating bonding terminals are located in an area between the first part and the second part; or
  some heating bonding terminals are located in the area between the first part and the second part, some other heating bonding terminals are located in an area on a side of the first part facing away from the second part, some other heating bonding terminals are located in an area on a side of the second part facing away from the first part.

10. The display panel according to claim 9, further comprising a test unit located in the second peripheral sub-area, an orthographic projection of the test unit on the substrate does not overlap with the orthographic projections of the first fan-out line and the second fan-out line on the substrate;
wherein the heating bonding terminals located in the area between the first part and the second part comprise a first group and a second group, and the test unit is located in an area between the first group and the second group.

11. The display panel according to claim 10, further comprising a plurality of dummy heating terminals located in the second peripheral sub-area, the dummy heating terminals are arranged in a same row, and are located on a side of the test unit facing away from the display area;
wherein a minimum distance between each of the dummy heating terminals and the edge of the display panel is equal to the minimum distance between each of the heating bonding terminals and the edge of the display panel, and each of the dummy heating terminals is electrically connected to the flexible circuit board.

12. The display panel according to claim 5, further comprising at least one fourth heating line located in the peripheral area, the fourth heating line is disposed around all of the first heating lines, the second heating lines and the third heating lines;
wherein a part of the fourth heating line arranged in the first peripheral sub-area is located on a side of the second heating lines facing away from the display area, a part of the fourth heating line arranged in the second peripheral sub-area is located on a side of the second fan-out lines facing away from the display area, an orthographic projection of the fourth heating line on the substrate at least partially overlaps with the orthographic projection of the first fan-out line on the substrate;
one end of the fourth heating line is connected to one of the heating bonding terminals, the other end of the fourth heating line is connected to another one of the heating bonding terminals, the fourth heating wire and two of the heating bonding terminals are configured to form a second closed loop.

13. The display panel according to claim 12, wherein the display panel comprises one among the fourth heating lines located in the peripheral area, except for a part of the fourth heating line arranged in the second peripheral sub-area, a line width of other parts of the fourth heating line is larger than a line width of the first heating line, the line width of other parts of the fourth heating line is greater than a line width of the second heating line, the line width of other parts of the fourth heating line is greater than a line width of the third heating line; or
the display panel further comprises a plurality of fourth heating lines located in the peripheral area, and the plurality of fourth heating lines are arranged in parallel.

14. A display device, comprising a flexible circuit board, at least one driver chip, and a display panel electrically connected to the flexible circuit board and the driver chip respectively, wherein the display panel comprises:
a substrate, comprising a display area and a peripheral area surrounding the display area;
a first conductive layer, located on a side of the substrate and comprising a plurality of data lines located in the display area; and
a second conductive layer, located on a side of the first conductive layer facing away from the substrate and comprising at least one first heating line group, wherein the first heating line group comprises at least one first heating line, the first heating line extends from the display area to the peripheral area, and extends in a direction same as an extending direction of the data line;
wherein the peripheral area further comprises a first peripheral sub-area and a second peripheral sub-area located on opposite sides of the display area;
wherein the second conductive layer further comprises at least one second heating line group located in the first peripheral sub-area, and the second heating line group comprises at least one second heating line;
wherein each of the first heating lines in the same first heating line group respectively intersects and connects with each of the second heating lines in one of the second heating line groups;
wherein the second conductive layer further comprises at least two third heating line groups located in the second peripheral sub-area, and each of the third heating line groups comprises at least one third heating line;
wherein a number of the third heating line groups is twice a number of the second heating line groups;
some first heating lines in the same first heating line group intersect and connect with each of the third heating lines in one of the third heating line groups, other first heating lines in the same first heating line group intersect and connect with each of the third heating lines in another one of the third heating line groups;
wherein the display panel further comprises at least two heating bonding terminals located in the second peripheral sub-area, one of the third heating line groups is electrically connected to one of the heating bonding terminals, and another one of the third heating line groups is electrically connected to another one of the heating bonding terminals;
wherein the first heating line group, the second heating line group, two of the third heating line groups and two of the heating bonding terminals are configured to form a first closed loop;
wherein the display panel further comprises at least one electronic static discharge unit located in the peripheral area, and one of the first closed loops is electrically connected to at least one of the electronic static discharge units.

15. The display device according to claim 14, wherein an orthographic projection of the first heating line on the substrate at least partially overlaps with an orthographic projection of the data line on the substrate.

16. The display device according to claim 15, wherein the display panel further comprises a black matrix layer located on a side of the second conductive layer facing away from the substrate,
an orthographic projection of a part of the first heating line, located in the display area, on the substrate is located within an orthographic projection of the black matrix layer on the substrate, and the orthographic projection of the data line on the substrate is located within the orthographic projection of the black matrix layer on the substrate.

* * * * *